(12) United States Patent
Yu et al.

(10) Patent No.: US 8,722,286 B2
(45) Date of Patent: May 13, 2014

(54) DEVICES AND METHODS FOR IMPROVED REFLECTIVE ELECTRON BEAM LITHOGRAPHY

(75) Inventors: Chen-Hua Yu, Hsinchu (TW); Jaw-Jung Shin, Hsinchu (TW); Shy-Jay Lin, Jhudong Township, Hsinchu County (TW); Burn Jeng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 148 days.

(21) Appl. No.: 13/484,588

(22) Filed: May 31, 2012

(65) Prior Publication Data

US 2013/0320225 A1    Dec. 5, 2013

(51) Int. Cl.
*G03F 1/20* (2012.01)

(52) U.S. Cl.
CPC ............... *G03F 1/20* (2013.01); *Y10S 430/143* (2013.01)

USPC ............... 430/5; 430/296; 430/323; 430/324; 430/942

(58) Field of Classification Search
CPC ........................................................ G03F 1/20
USPC ......... 430/5, 272.1, 275.1, 296, 323, 324, 942
See application file for complete search history.

(56) References Cited

U.S. PATENT DOCUMENTS 6,870,172 B1  3/2005  Mankos et al.
7,755,061 B2  7/2010  Grella et al.

*Primary Examiner* — Christopher Young
(74) *Attorney, Agent, or Firm* — Haynes and Boone, LLP

(57) ABSTRACT

A device for reflective electron-beam lithography and methods of producing the same are described. The device includes a substrate, a plurality of conductive layers formed on the substrate, which are parallel to each other and separated by insulating pillar structures, and a plurality of apertures in each conductive layer. Apertures in each conductive layer are vertically aligned with the apertures in other conductive layers and a periphery of each aperture includes conductive layers that are suspended.

20 Claims, 22 Drawing Sheets

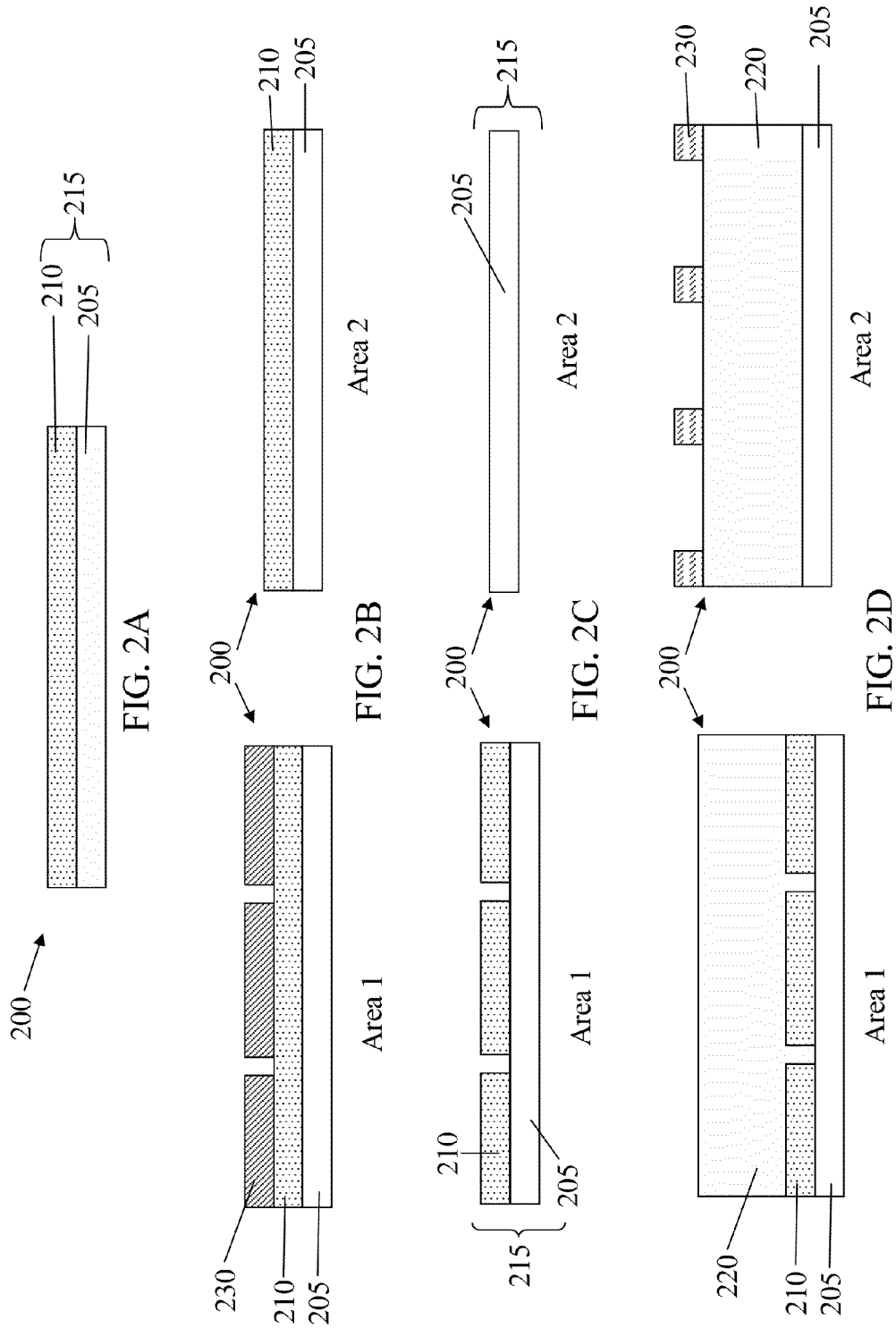

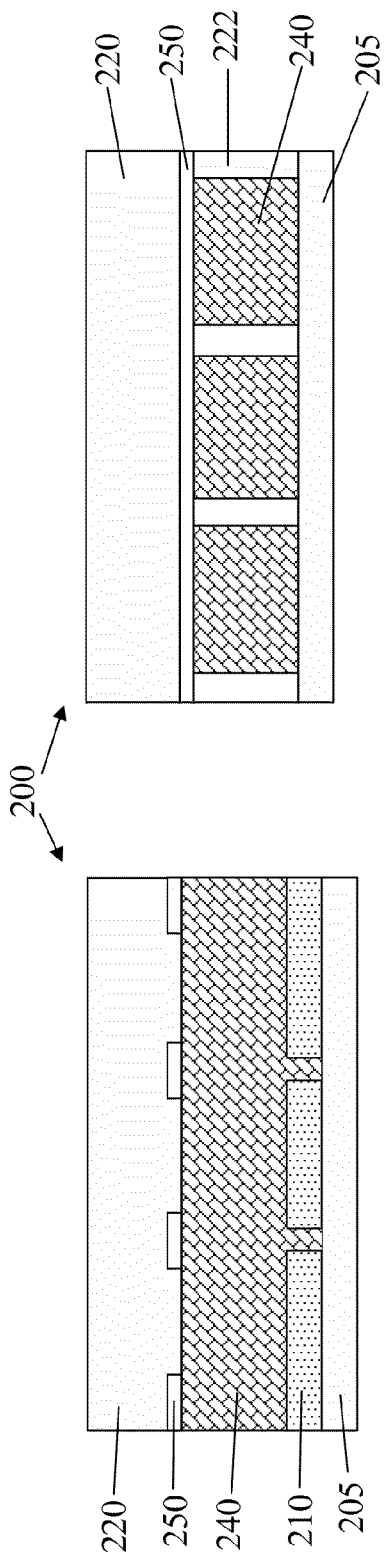
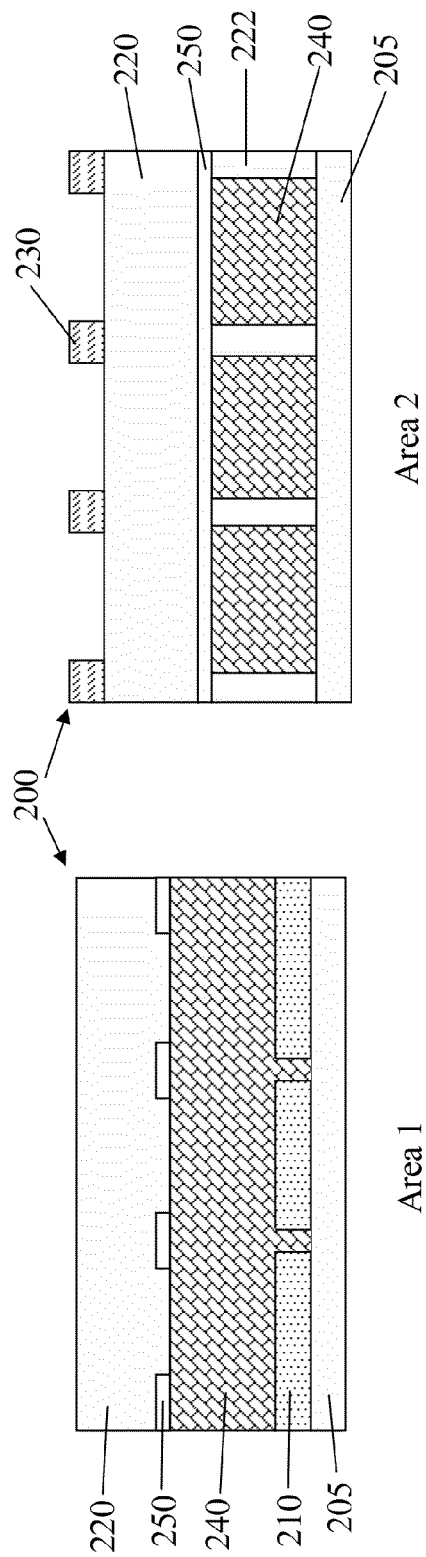
FIG. 2I
FIG. 2J

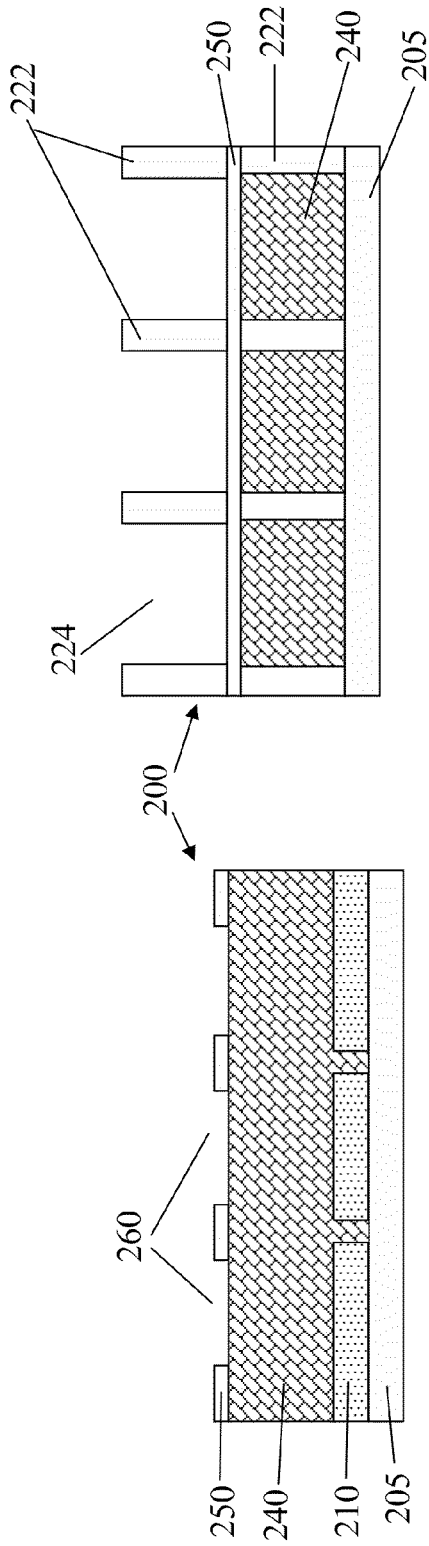
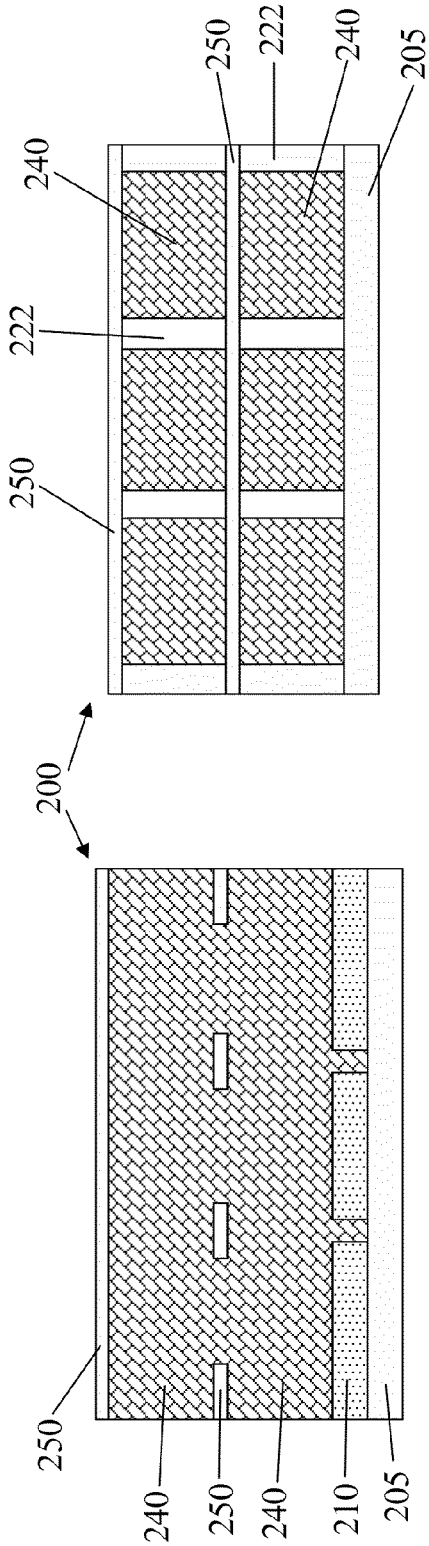
FIG. 2K
FIG. 2L

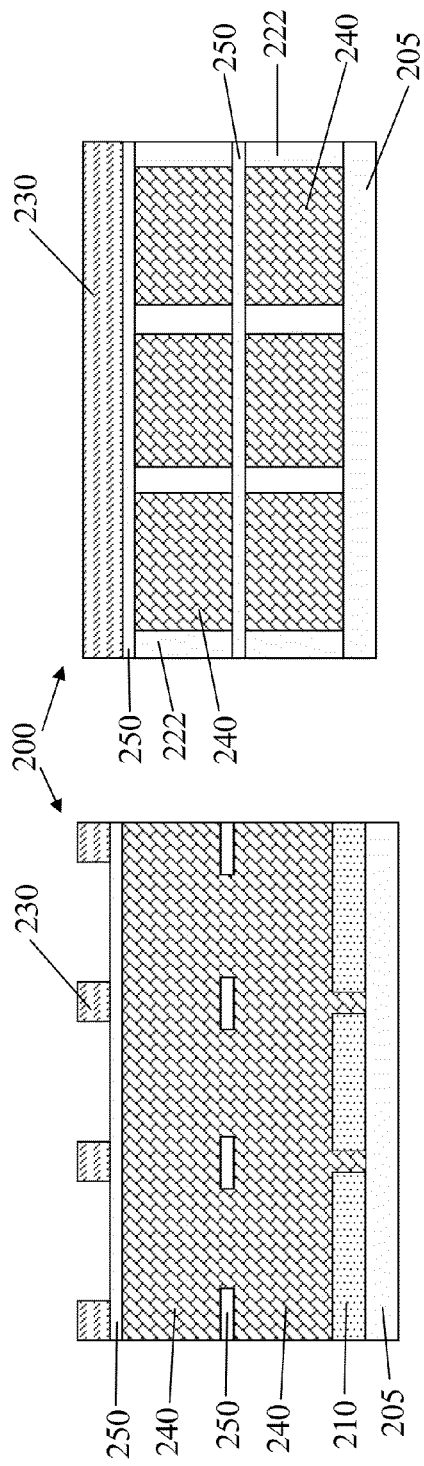
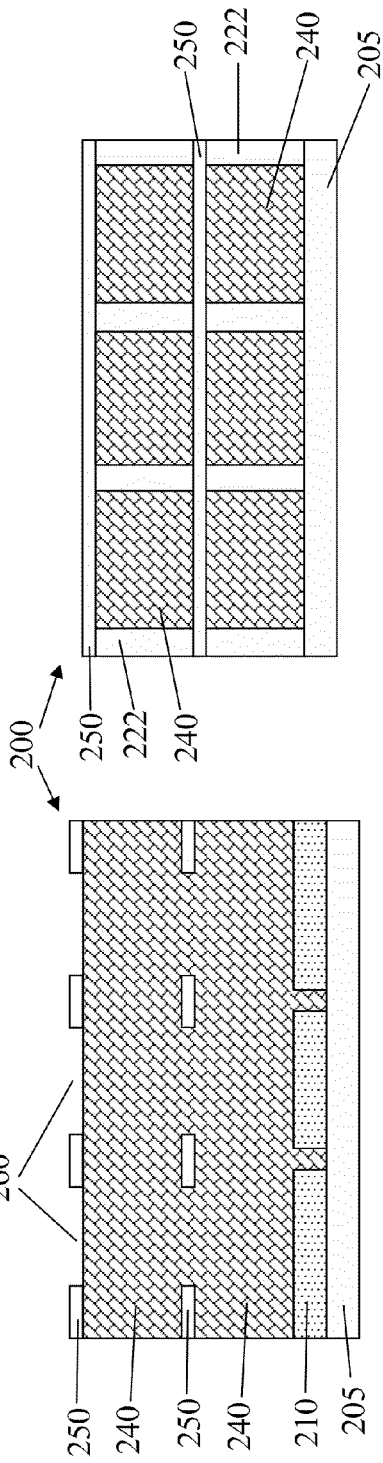
FIG. 2M
FIG. 2N

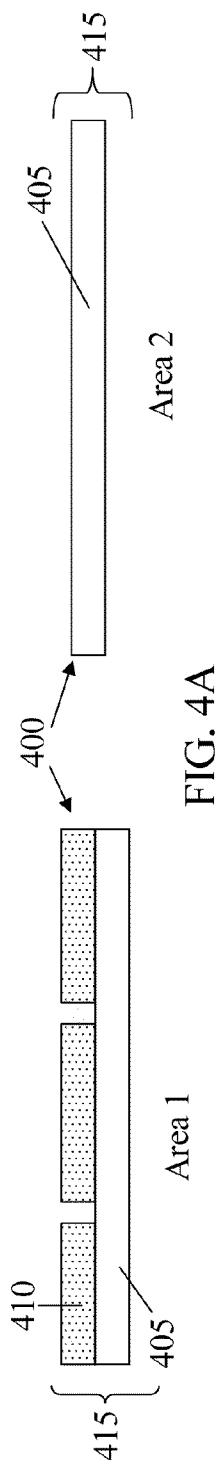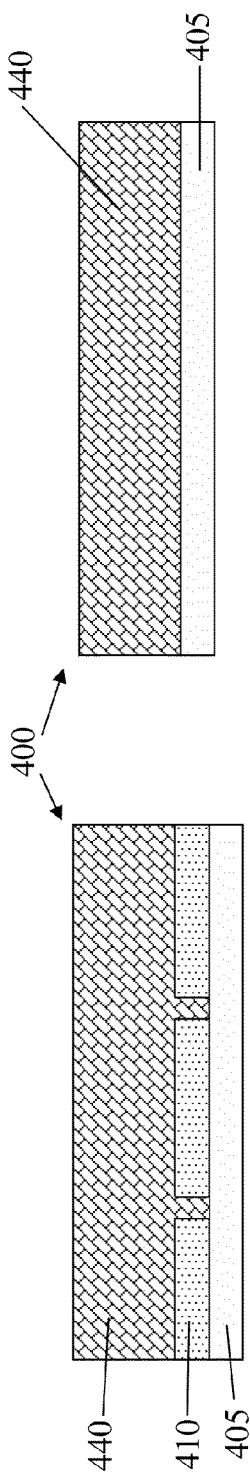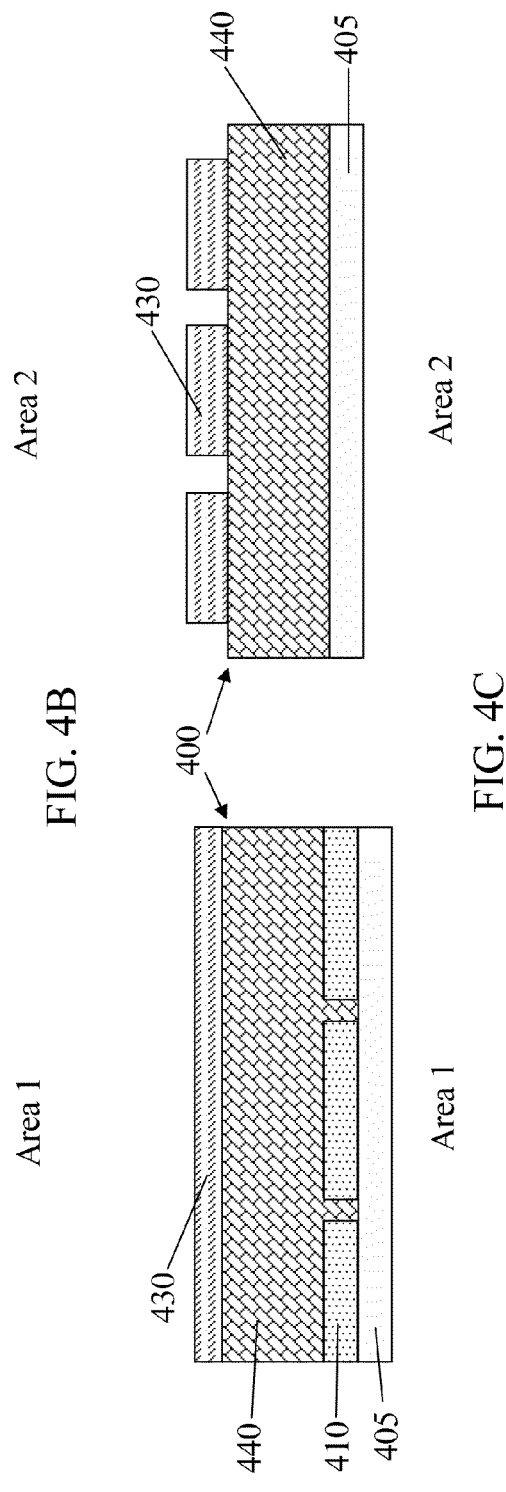
FIG. 4A
FIG. 4B
FIG. 4C

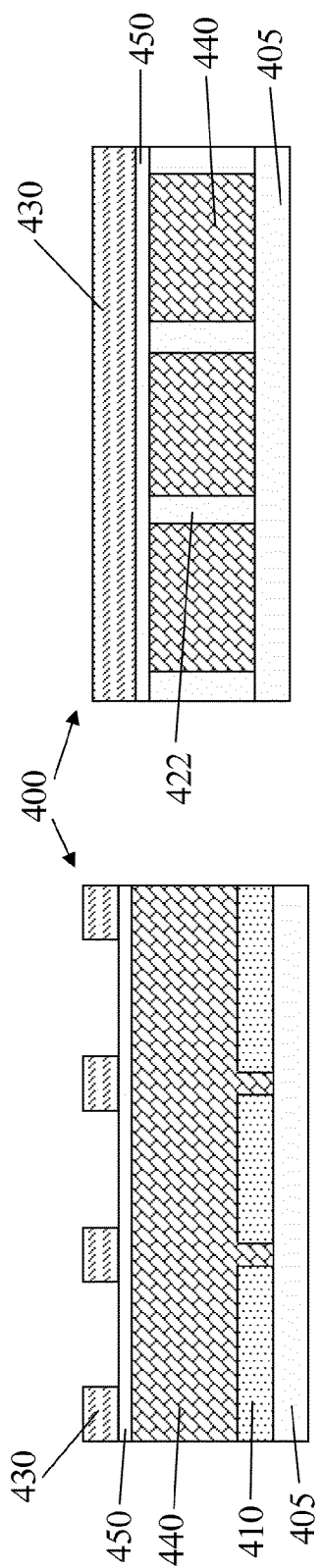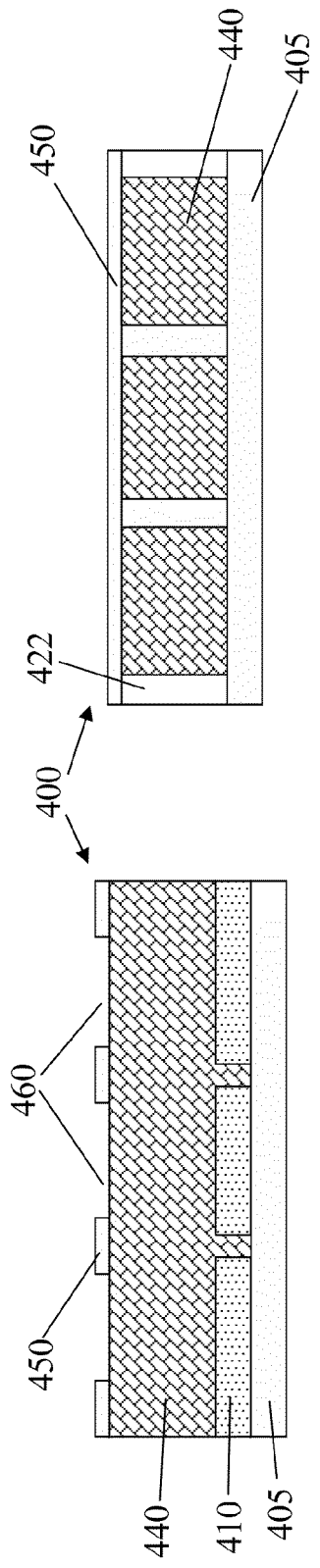
FIG. 4F
FIG. 4G

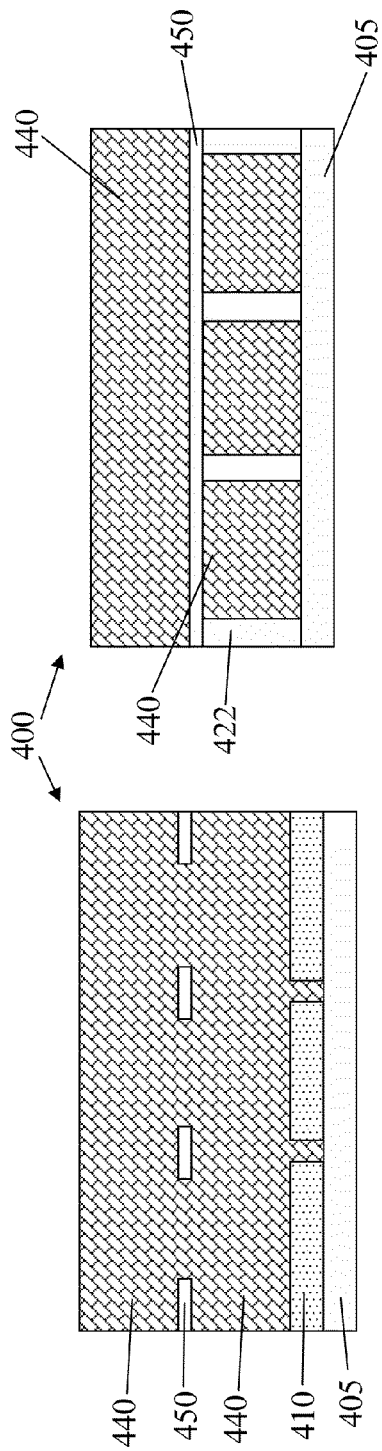
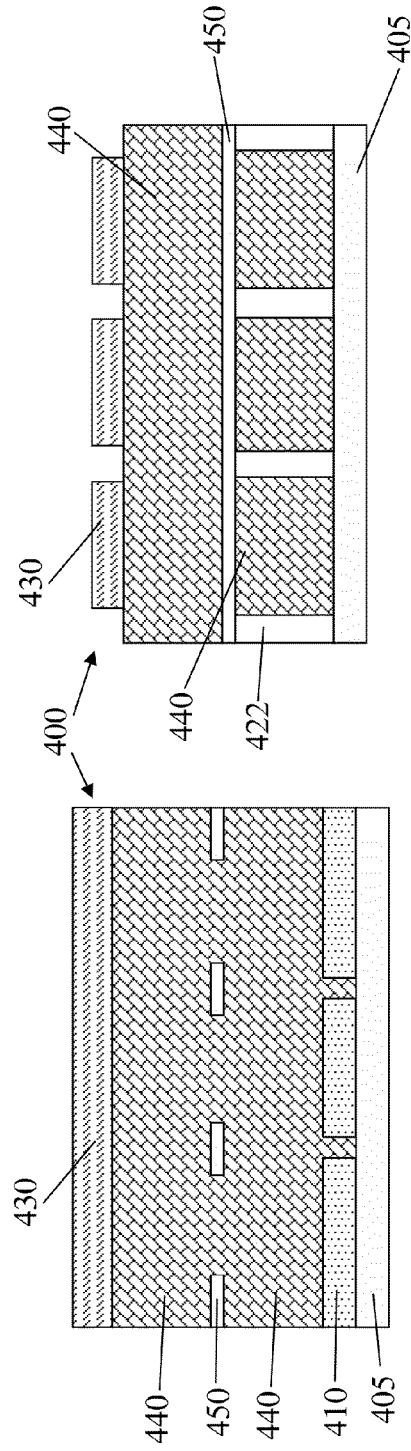
FIG. 4H
FIG. 4I

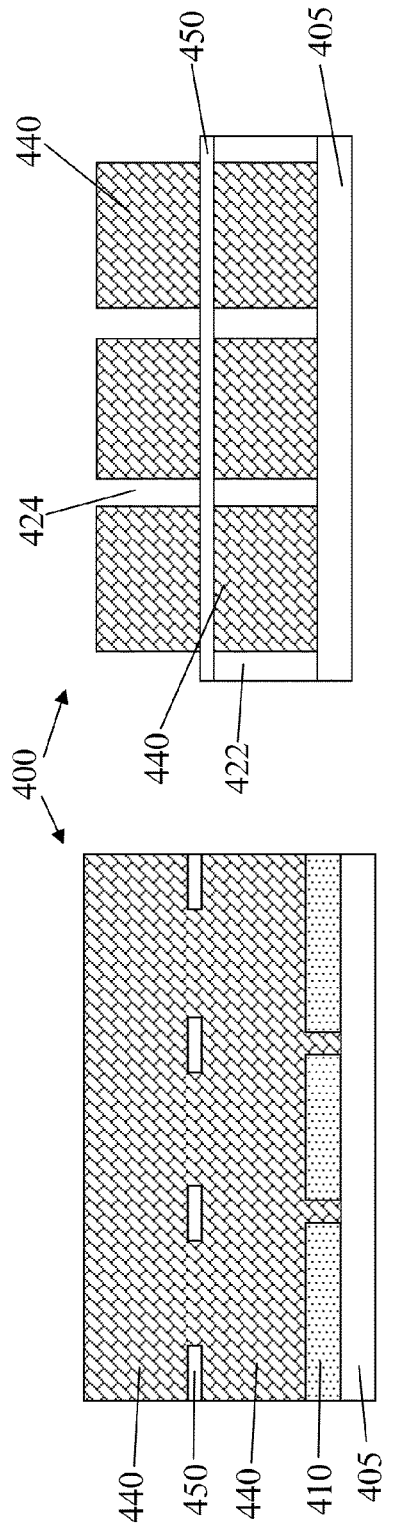
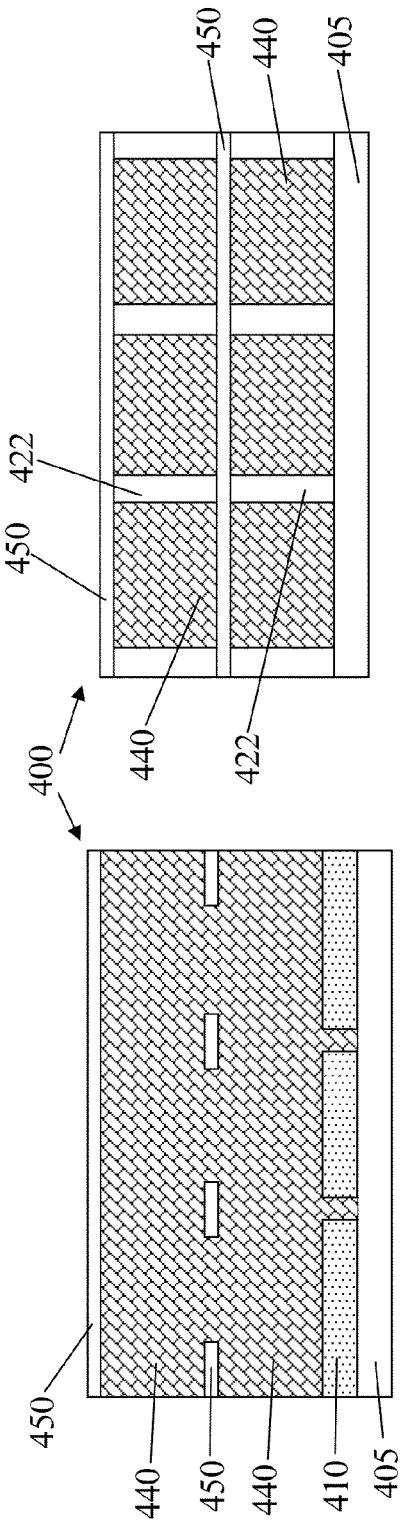
FIG. 4J
FIG. 4K

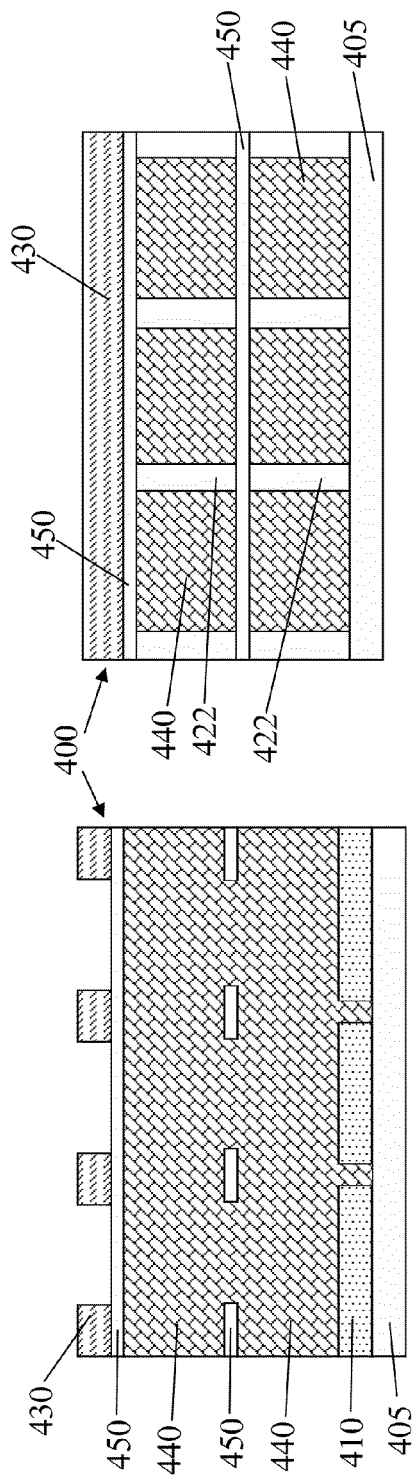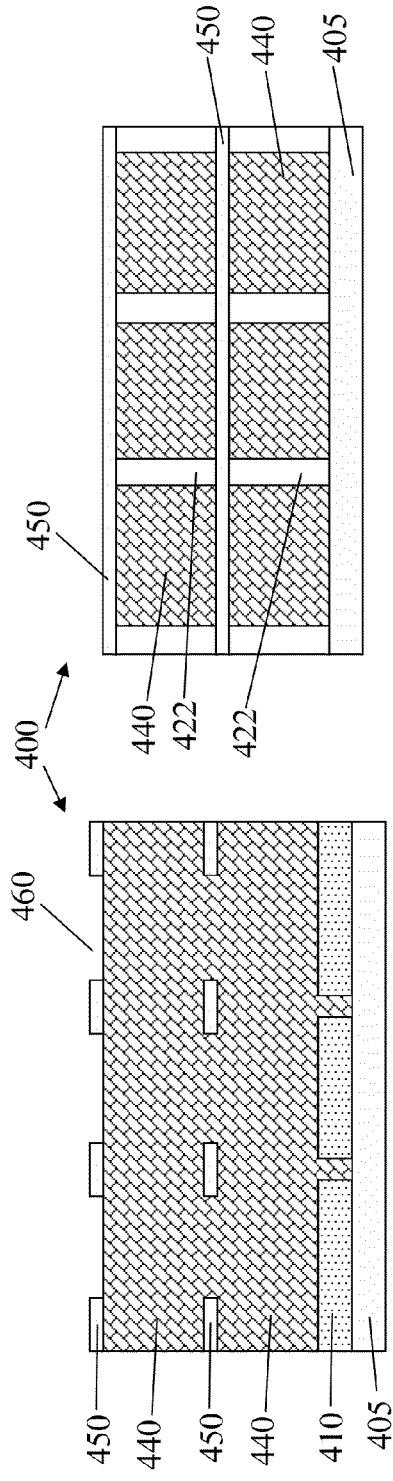
FIG. 4L
FIG. 4M

DEVICES AND METHODS FOR IMPROVED REFLECTIVE ELECTRON BEAM LITHOGRAPHY

BACKGROUND

As is well-understood in the art, a lithographic process includes the patterned exposure of a resist so that portions of the resist can be selectively removed to expose underlying areas for selective processing such as by etching, material deposition, implantation and the like. Traditional lithographic processes utilize electromagnetic energy in the form of ultraviolet light for selective exposure of the resist. As an alternative to electromagnetic energy (including x-rays), charged particle beams have been used for high resolution lithographic resist exposure. In particular, electron beams have been used since the low mass of electrons allows relatively accurate control of an electron beam at relatively low power and relatively high speed.

In reflective electron beam lithography, a lenslet of a mirror made by micro-electro-mechanical systems (MEMS) is used to reflect electrons back to a wafer for patterning. Typical lenslet structures include insulators between metal electrodes that are hit by electrons, which causes charging and deteriorates lenslet functionality. Accordingly, improved devices and methods are needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity. It is noted that the same or similar features may be similarly numbered herein for the sake of simplicity and clarity. In addition, some of the drawings may be simplified for clarity. Thus, the drawings may not depict all of the components of a given apparatus (e.g., device) or method.

Figure 1:
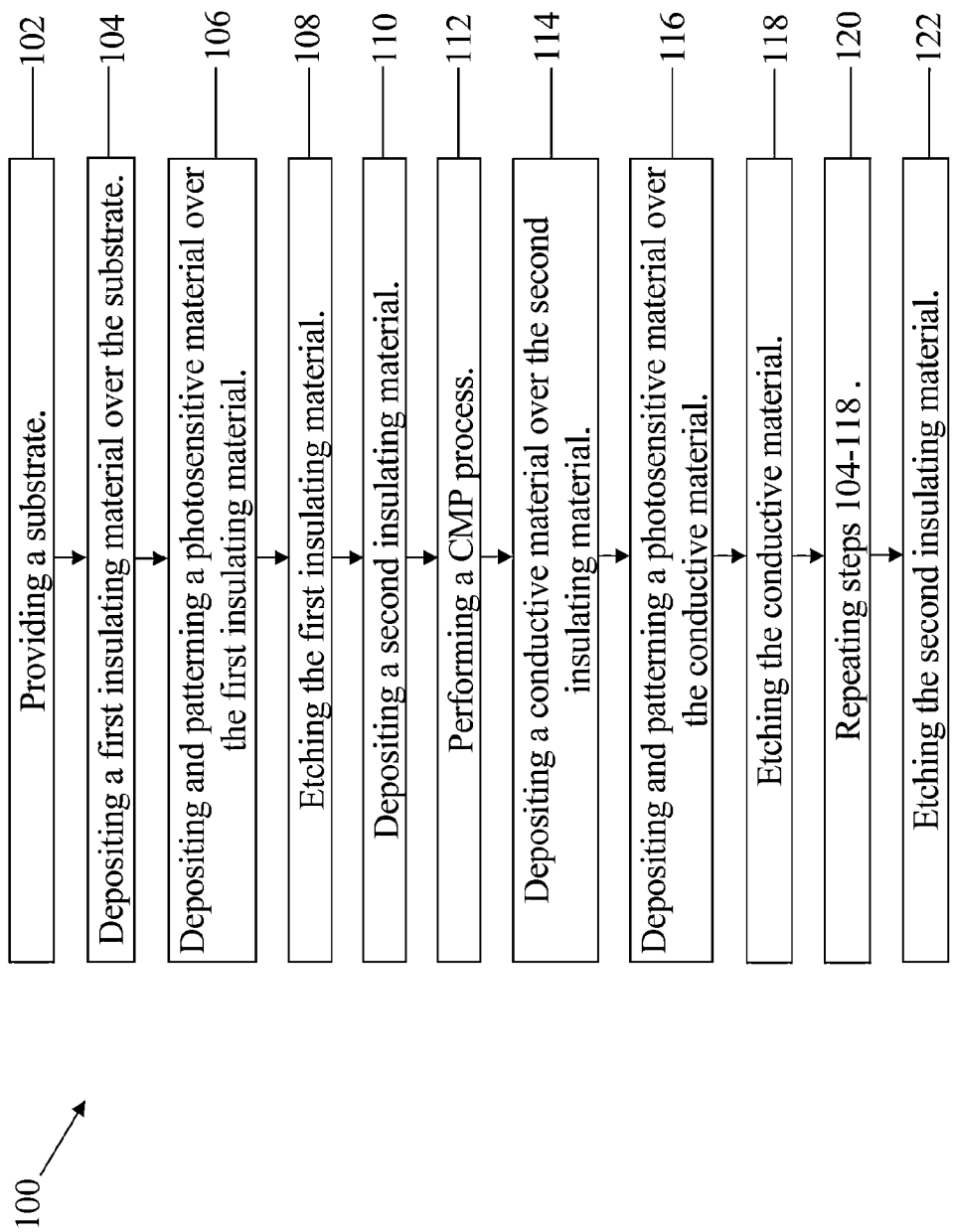
FIG. 1 is a flowchart of one embodiment of a method of making a device according to aspects of the present disclosure.
Figure 2E:
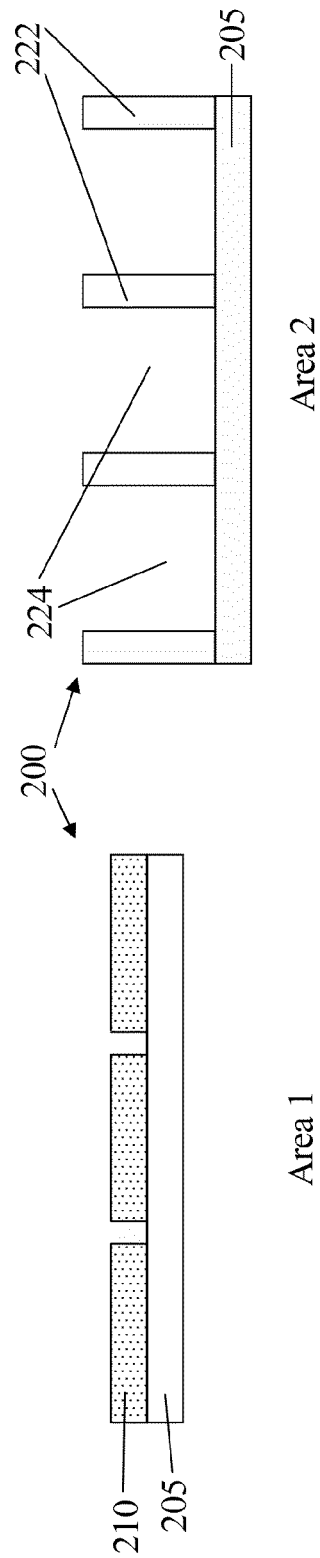
FIGS. 2A-2P are sectional views of a device constructed according to aspects of the present disclosure.
FIG. 2Q is a top view of the substrate of a device constructed according to aspects of the present disclosure.
FIG. 2R is a top view of the upper lenslet sub-layer of a device constructed according to aspects of the present disclosure.

FIG. 1 is a flowchart of an embodiment of a method 100 for making a device constructed according to various aspects of the present disclosure in one or more embodiments. FIGS. 2A-2P are sectional views of a device 200 at various fabrication stages and constructed according to one or more embodiments. The device 200 and the method 100 of making the same are collectively described with reference to FIGS. 1 through 2R. It should be understood that while Area 1 and Area 2 are shown separately, Areas 1 and 2 are formed simultaneously. For example, during an etching step, Areas 1 and 2 are both etched in the same step instead of in two separate steps.

Figure 2F:
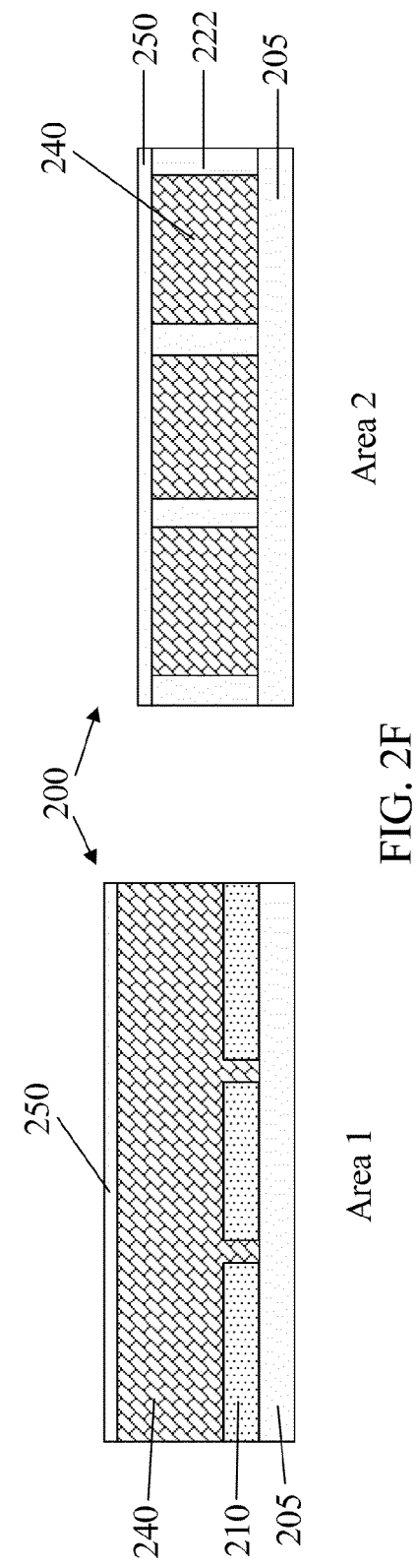
Figure 2G:
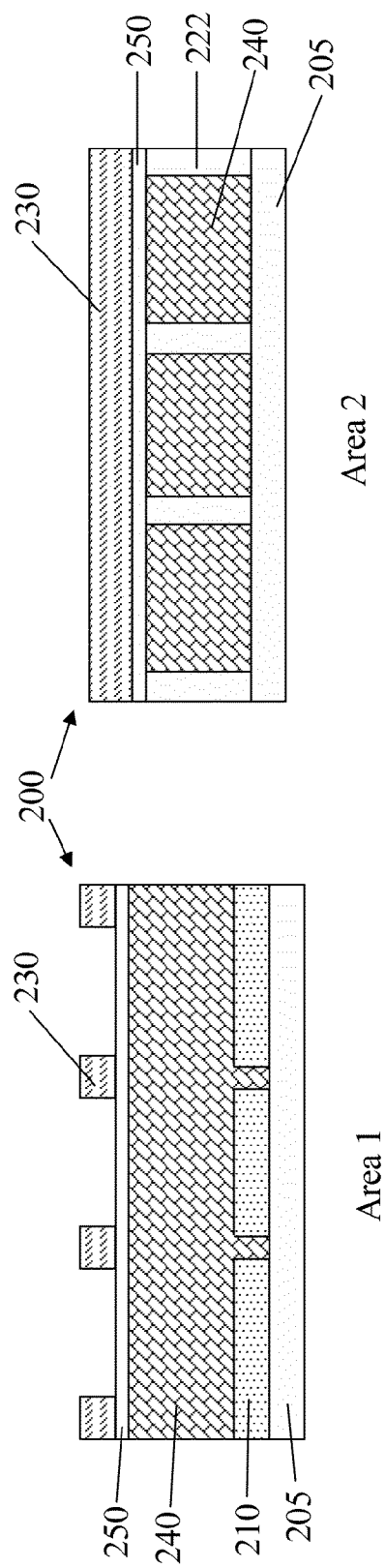
Figure 2H:
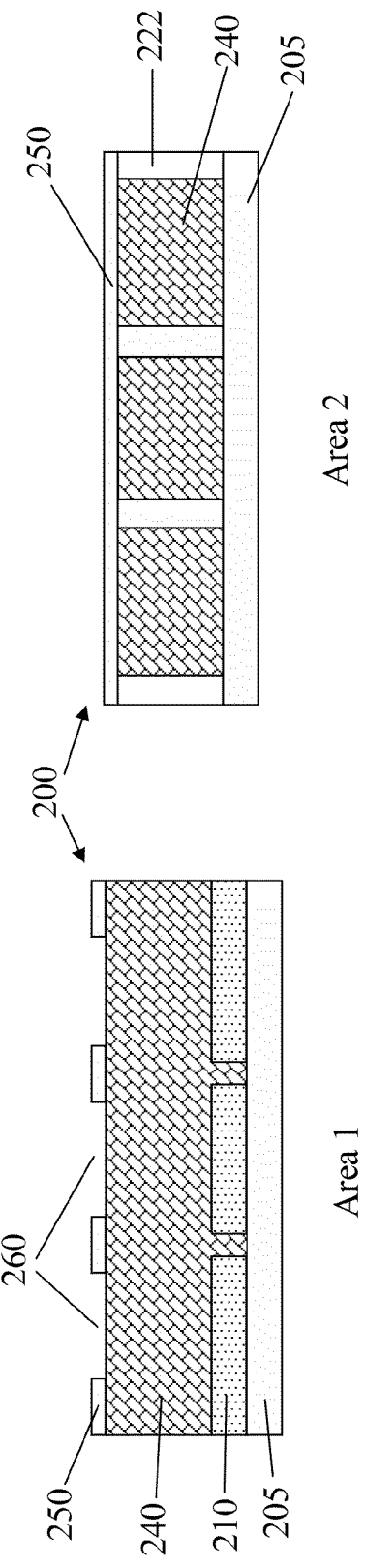
Figure 2O:
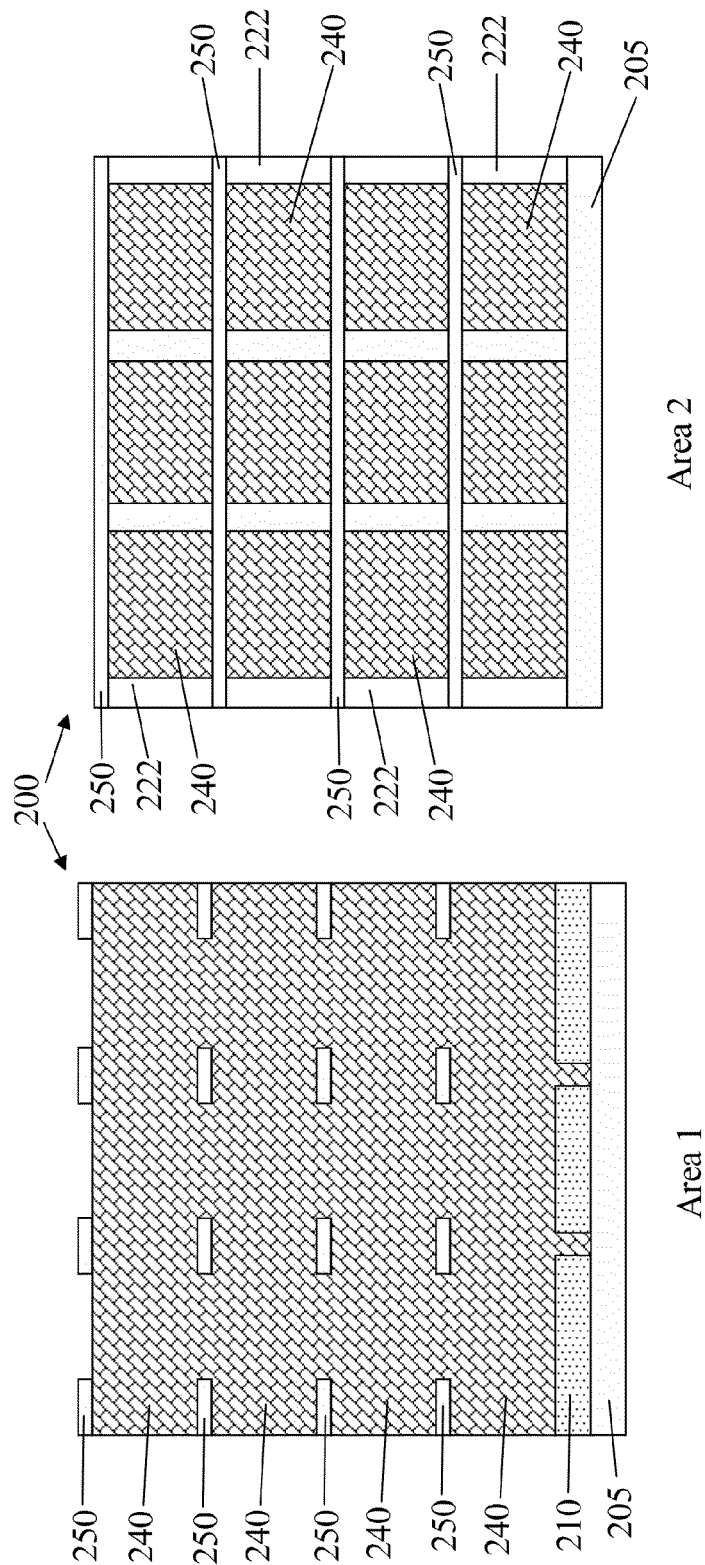
Figure 2P:
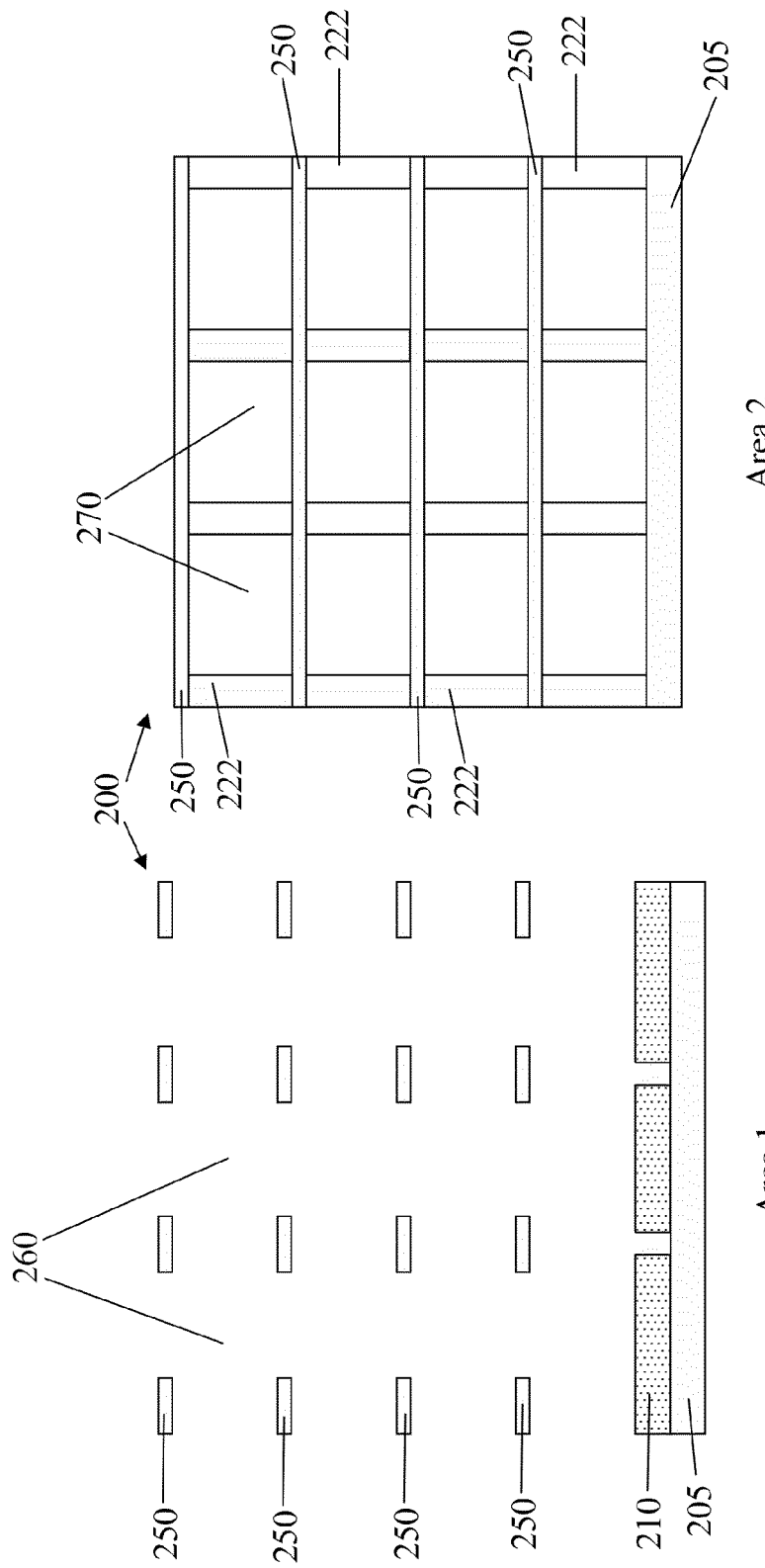
Figure 2Q:
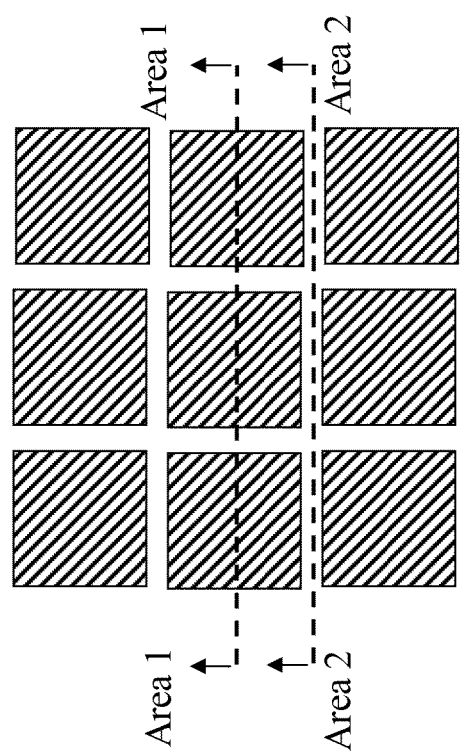
Figure 2R:
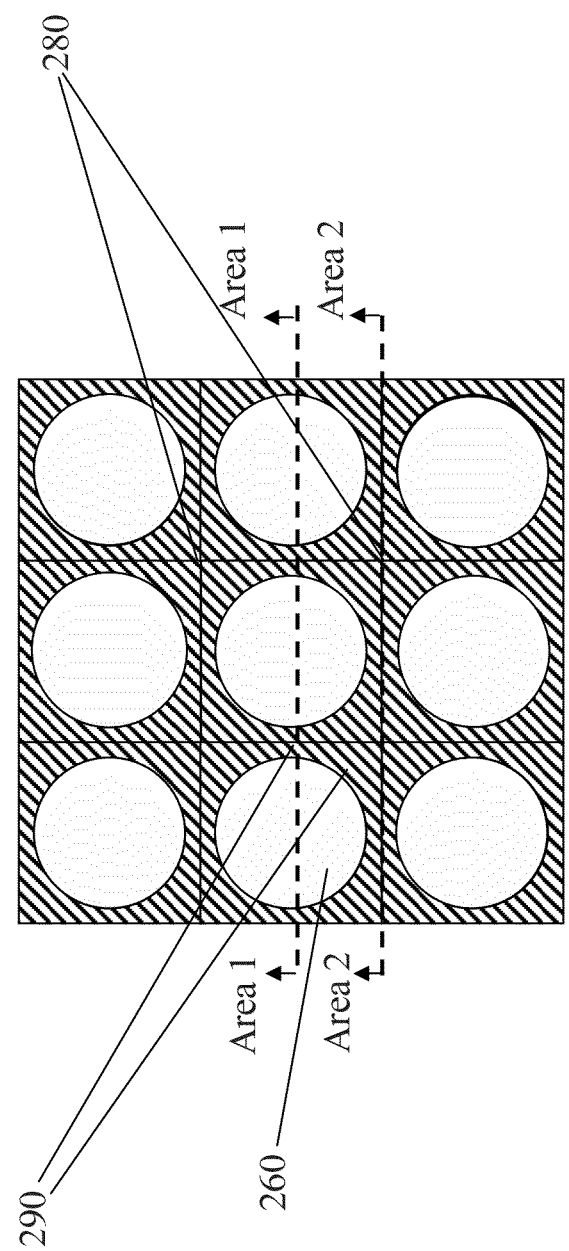

Before describing the method 100, reference is first made to FIG. 2R, which is a top view of the upper lenslet sub-layer of the device 200 respectively. Area 1 is the portion of the device 200 that encompasses the apertures 260 as seen in FIG. 2R. Area 2 is the portion of the device 200 that does not encompass the apertures 260 and is between rows of apertures 260. As further explained below, Area 1 is completely free of insulating material while Area 2 includes insulating pillar structures to physically support the conductive layers.

The method 100 begins at step 102 by providing a substrate 215 that includes a conductive material 210, such as a metal, and a supporting member 205. The supporting member 205 can be a passivation layer on the top of a CMOS chip or a film of insulators on the top of a silicon substrate. In FIG. 2A, the substrate 215 includes a metal 210. The metal may be any suitable material known in the art, including titanium nitride, tungsten, aluminum, copper, and combinations thereof.

A method of making the substrate 215 is illustrated in FIGS. 2A-2C. First, as shown in FIG. 2A, a layer of conductive material 210 is deposited over a layer of a supporting member 205. Next, in FIG. 2B, a photosensitive material 230 is deposited on the layer of conductive material 210 and patterned. In Area 1, the photosensitive material 230 is patterned so that the conductive material 210 is partially exposed. In contrast, the photosensitive material 230 in Area 2 is removed so that the conductive material 210 is completely exposed. In FIG. 2C, the conductive material 210 is etched. All of the conductive material 210 is removed in Area 2 of FIG. 2C, while only the parts of conductive material 210 that are not covered by photosensitive material 230 are etched in Area 1. FIG. 2Q is a top view of Areas 1 and 2 of substrate 215 in FIG. 2C.

At step 104, a first insulating material 220 is deposited over the substrate 215 as shown in FIG. 2D. The insulating material includes any suitable insulating material, such as silicon oxide, silicon nitride, or silicon oxynitride. The layer of first insulating material 220 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art.

Referring still to FIG. 2D, a photosensitive material 230 is deposited on the first insulating material 220 and patterned in step 106. In Area 1, the photosensitive material 230 is patterned so that the first insulating material 220 is completely exposed. In contrast, the photosensitive material 230 in Area 2 is patterned so that the first insulating material 220 is partially exposed.

In Area 2, the photosensitive material 230 that has been patterned includes various openings that define portions for trenches and expose those portions to subsequent etch. In one embodiment, the photosensitive material 230 is patterned by a procedure including coating, exposure, post exposure baking, and developing. Particularly, the resist coating may utilize spin-on coating. In one example of the exposure, the coated resist layer is selectively exposed by radiation beam through a mask having a predefined pattern. The radiation beam includes ultraviolet (UV) light in one example. The exposing process may be further extended to include other technologies such as a maskless exposing or writing process. After the exposing process, the resist material 230 is further processed by a thermal baking process, referred to as a post exposure bake (PEB). The PEB may induce a cascade of chemical transformations in the exposed portion of the resist layer, which is transformed to have an increased solubility of the resist in a developer. Thereafter, the resist layer on the substrate is developed such that the exposed resist portion is dissolved and washed away during the developing process. The lithography processes described above may only present a subset of processing steps associated with a lithography patterning technique. The lithography process may further include other steps such as cleaning and baking in a proper sequence. For example, the developed resist layer may be further baked, which is referred to as hard baking.

Proceeding to step 108, the first insulating material 220 is etched. All of the first insulating material 220 is removed in Area 1 of FIG. 2E, while only the parts of first insulating material 220 that are not covered by photosensitive material 230 are etched in Area 2. The first insulating material 220 is etched to form trenches 224 and to form insulating pillars 222 formed by first insulating material 220 in Area 2. The insulating pillars 222 provide electrical insulation and physical support between the substrate 215 and future conductive material layers in the final structure. As discussed later, Area 1 does not include any insulating material and the metal electrodes are suspended.

The first insulating material 220 may be etched by various methods, including a dry etch, a wet etch, or a combination of dry etch and wet etch. The dry etching process may implement by fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr and/or CHBR3), oxygen-containing gas, iodine-containing gas, other suitable gases and/or plasmas, and/or combinations thereof. The etching process may include a multiple-step etching to gain etch selectivity, flexibility and a desired etch profile. The photosensitive material 230 is removed.

In step 110, a second insulating material 240, which is different from the first insulating material 220, is deposited in the trenches 224 in the Area 2 and on the substrate 215 in Area 1 at the same time, as shown in FIG. 2F. A chemical mechanical polishing (CMP) process is performed to remove excess second insulating material 240 to expose a top surface of the insulating pillars 222 in Area 2 and planarize the top surface of the second insulating material 240 in step 112. A conductive material 250 is deposited on the planarized second insulating material 240 in step 114. The conductive material 250 may be any suitable material, such as a metal including aluminum (Al), copper (Cu) or tungsten (W).

Moving to step 116, the photosensitive material 230 is deposited and patterned on the conductive material 250 as shown in FIG. 2G. In Area 1, the photosensitive material 230 is patterned so that portions of the conductive material 250 are exposed, while in Area 2, the photosensitive material 230 completely covers the conductive material 250, leaving no portion exposed.

In step 118, the conductive material 250 is etched. As can be seen in FIG. 2H, in Area 1, the portions protected by the photosensitive material 230 remain, while those portions that are unprotected are etched away to form apertures 260 for lenslets. In Area 2, none of the conductive material 250 is etched because the photosensitive material 230 protects all of the conductive material 250 in Area 2. FIG. 2H illustrates a first lenslet sub-layer.

In step 120, steps 104 to 118 are repeated to form a second lenslet sub-layer over the first lenslet sub-layer. In FIG. 2I, a first insulating material 220 is deposited at the same time over Area 1 and Area 2. FIG. 2J illustrates Areas 1 and 2 after a photosensitive material 230 is deposited on the first insulating material 220 and patterned. Again, Area 1 is completely exposed after patterning, while only portions of the first insulating material 220 are exposed in Area 2. In FIG. 2K, the first insulating material 220 is completely etched away in Area 1. At the same time, in Area 2, the etching forms insulating pillars 222 and trenches 224. The photosensitive material 230 is removed. In FIG. 2L, a second insulating material 240, which is different from the first insulating material 220, is deposited in the trenches 224 in Area 2 and on the conductive material 250 in Area 1 at the same time. The second insulating layer 240 is planarized to remove excess second insulating material 240 to expose a top surface of the insulating pillars 222 in Area 2. A conductive material 250 is deposited on the planarized second insulating material 240. In FIG. 2M, a photosensitive material 230 is deposited on the conductive material 250 and patterned. Area 1 is patterned such that portions of the conductive material 250 are exposed, while Area 2 is patterned such that all of the conductive layer 250 is covered or unexposed. In FIG. 2N, a portion of the conductive material 250 is etched in Area 1 to form apertures 260 for lenslets. The photosensitive material 230 is removed. FIG. 2N illustrates the second lenslet sub-layer over the first lenslet sub-layer. FIG. 2O illustrates Areas 1 and 2 after the method 100 has been repeated multiple times to form multiple layers. The thickness of the conductive layers 250 is about 20-500 nm and the height of the insulating pillars 222 is about 200-1000 nm.

In step 122, a total-second-insulator-removing (TSIR) etch is performed as shown in FIG. 2P. The second insulating material 240 is completely etched away by the TSIR etch in Area 1 and Area 2. In Area 2, cavities 270 are formed by the TSIR etch. The first insulating material 220 and second insulating material 240 are selected to have different etch rates. By providing materials with different etch rates, highly selective etching may be achieved in the TSIR etch so that only second insulating material 240 is etched and not insulating pillars 222 formed by the first insulating material 220. The high etch selectivity between the first insulating material 220 and the second insulating material 240 in the TSIR etch makes method 100 feasible for pillar formation to support the metal electrode in Area 2 and metal electrode suspension in Area 1.

As is shown in FIG. 2P, between two adjacent parallel conductive layers 250, a layer of insulating pillars 222 are in Area 2 to physically support the conductive material 250 in Area 1 and Area 2. Referring to FIG. 2R, a periphery 290 of each aperture 260 includes conductive layers 250 that are suspended and do not include any insulating material. The conductive material 250 in Area 1 is suspended, meaning it is not directly supported underneath by insulating pillars 222. In contrast, the conductive material 250 in Area 2 is supported by insulating pillars 222. The apertures 260 in each conductive layer 250 are vertically aligned with the apertures in other conductive layers. Referring back to FIG. 2R, in one embodiment, the insulating pillar 222 is located at an inner center 280 of a square grid of four lenslets. In another embodiment, the insulating pillar 222 is located between two adjacent lenslets.

In an exemplary embodiment, a diameter of the apertures 260 is about 0.5 to 0.95 times a lenslet pitch. In another embodiment, a diameter of the insulating pillar structures 222 is about 0.1 to 0.4 times a lenslet pitch. In one embodiment, an insulating pillar structure sidewall angle is from about 60 to 90 degrees. A thickness of the conductive material 250 is typically about 20 to 500 nm.

FIG. 2R illustrates the top view of Areas 1 and 2 in FIG. 2P. The overall structure of Area 1 and Area 2 provides a structure that prevents electron charging on the insulator of the lenslet in Area 1 and helps to extend the lifetime of the lenslet structure. This is achieved by totally removing insulating material in Area 1 and minimizing insulation material in Area 2 so that when the electron beam hits the lenslet, reflected electrons do not hit an insulator sidewall and induce charging. The lenslet device that includes Area 1 or the metal electrode suspension can prevent insulating materials or high resistive materials from electron bombardment, which causes charging on the insulator or deteriorates the properties of the high resistive materials. The protection of the insulator or high resistive materials between metal electrodes in the lenslet from electron radiation, which prevents charging problems, can extend the stability and lifetime of the device 200.

Figure 3:
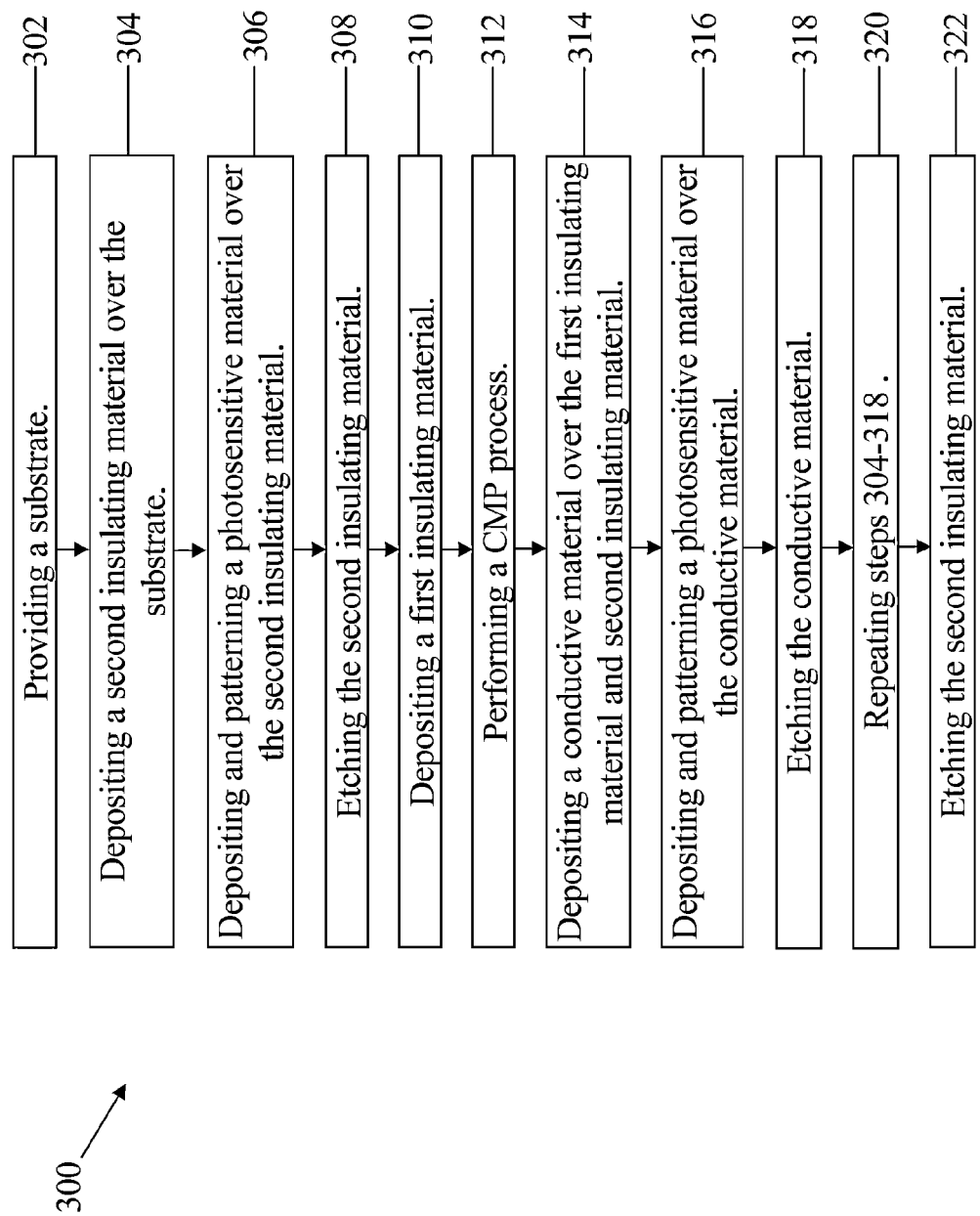
FIG. 3 is a flowchart of another embodiment of a method of making a device according to aspects of the present disclosure.
Figure 4D:
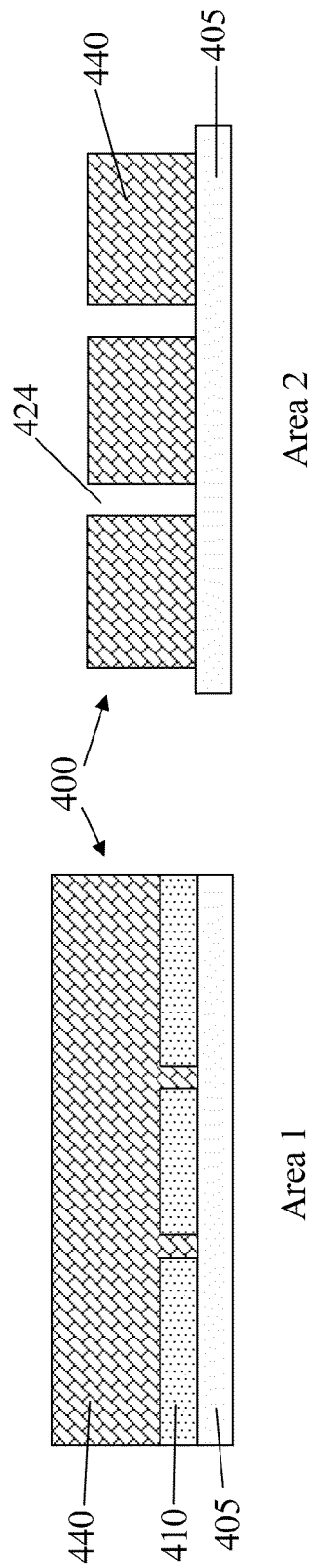
FIGS. 4A-4O are sectional views of a device constructed according to aspects of the present disclosure.
FIG. 4P is a top view of the substrate of a device constructed according to aspects of the present disclosure.
FIG. 4Q is a top view of the upper lenslet sub-layer of a device constructed according to aspects of the present disclosure.

FIG. 3 is a flowchart of another embodiment of a method 300 for making a device 400 constructed according to various aspects of the present disclosure in one or more embodiments. FIGS. 4A-4O are sectional views of a device 400 at various fabrication stages and constructed according to one or more embodiments. The device 400 and the method 300 of making the same are collectively described with reference to FIGS. 3 through 4Q. It should be understood that while Area 1 and Area 2 are shown separately, Areas 1 and 2 are formed simultaneously. For example, during an etching step, Areas 1 and 2 are both etched in the same step instead of in two separate steps.

Figure 4E:
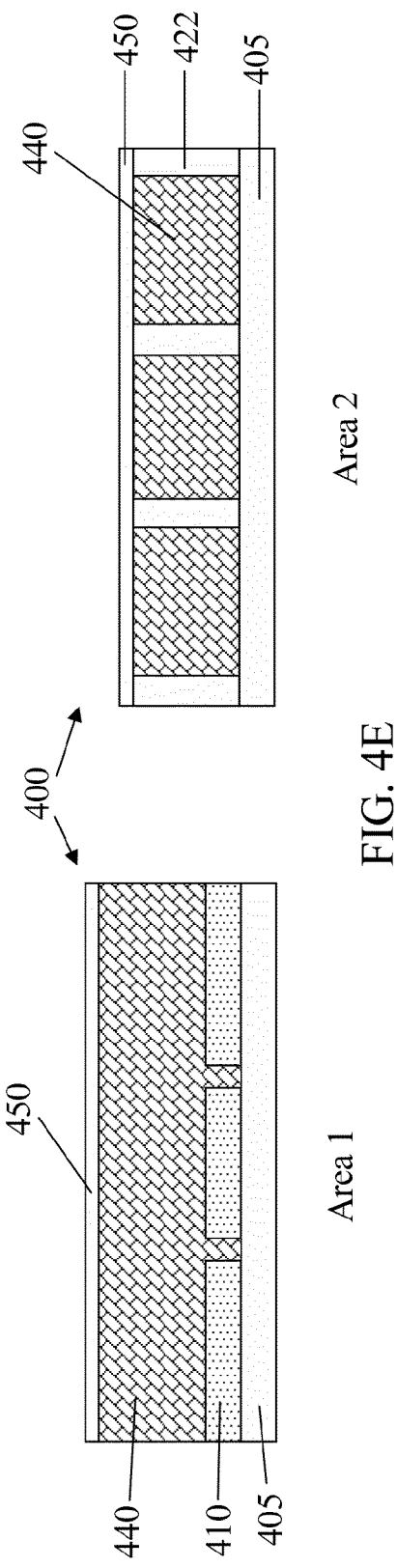
Figure 4N:
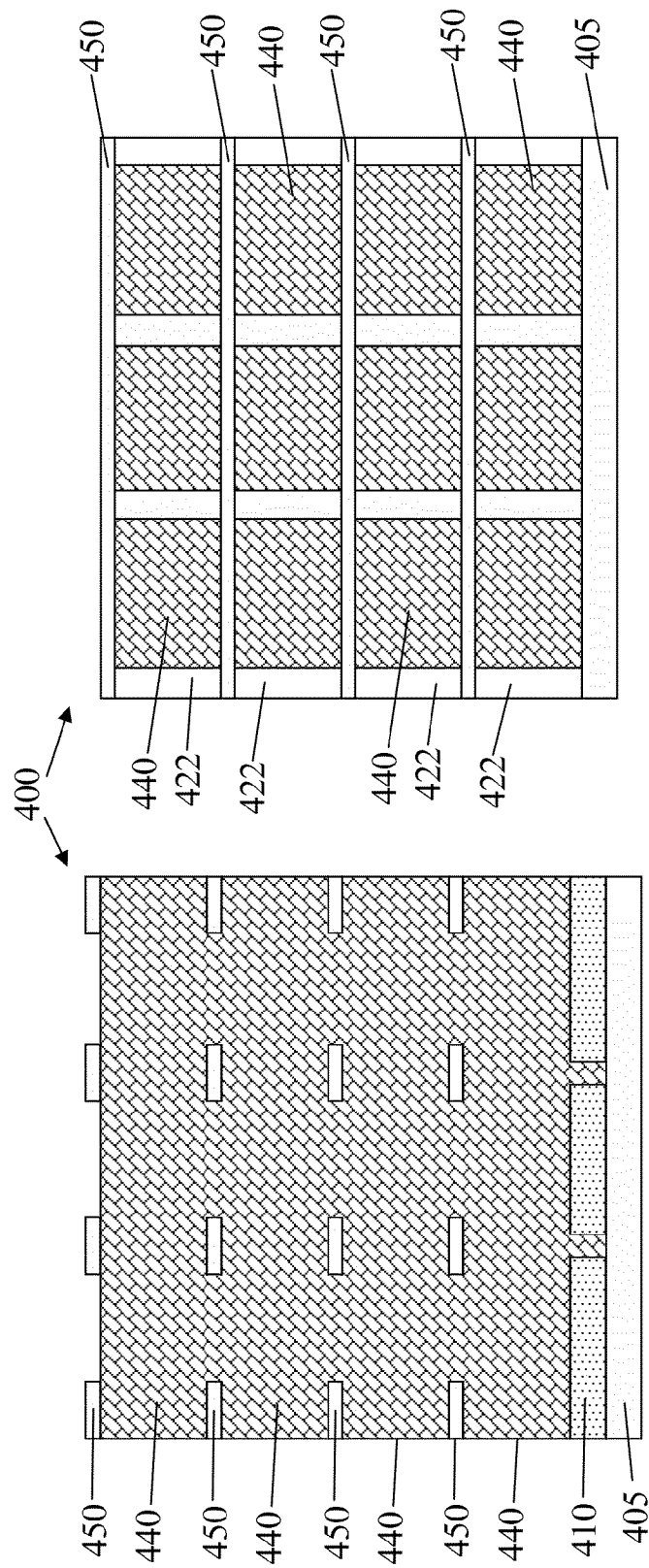
Figure 4O:
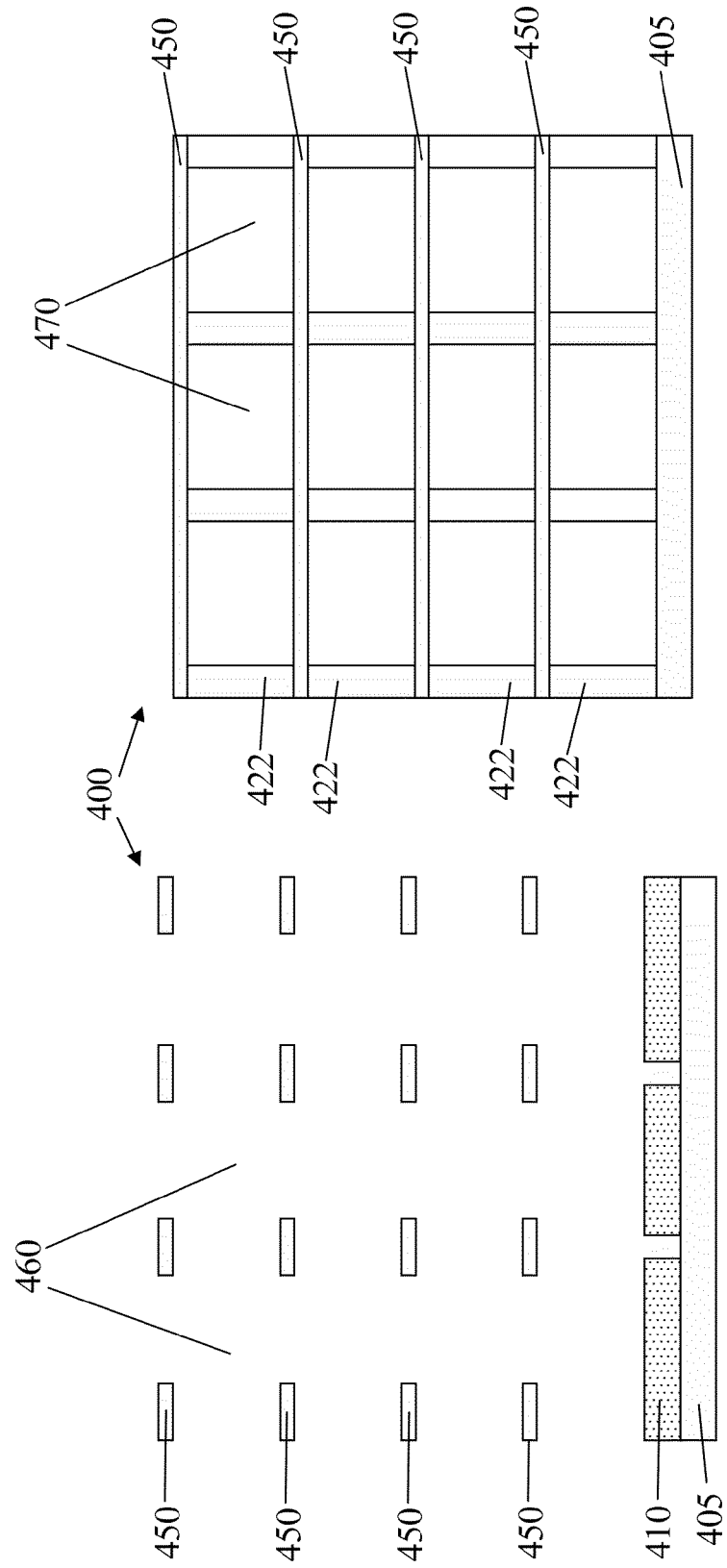
Figure 4P:
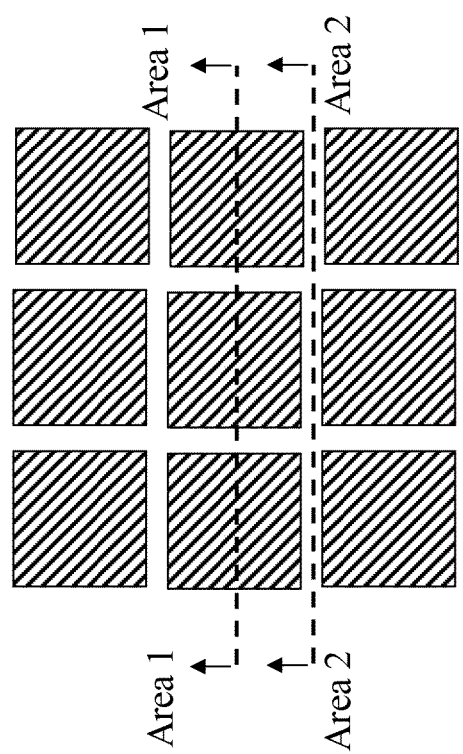
Figure 4Q:
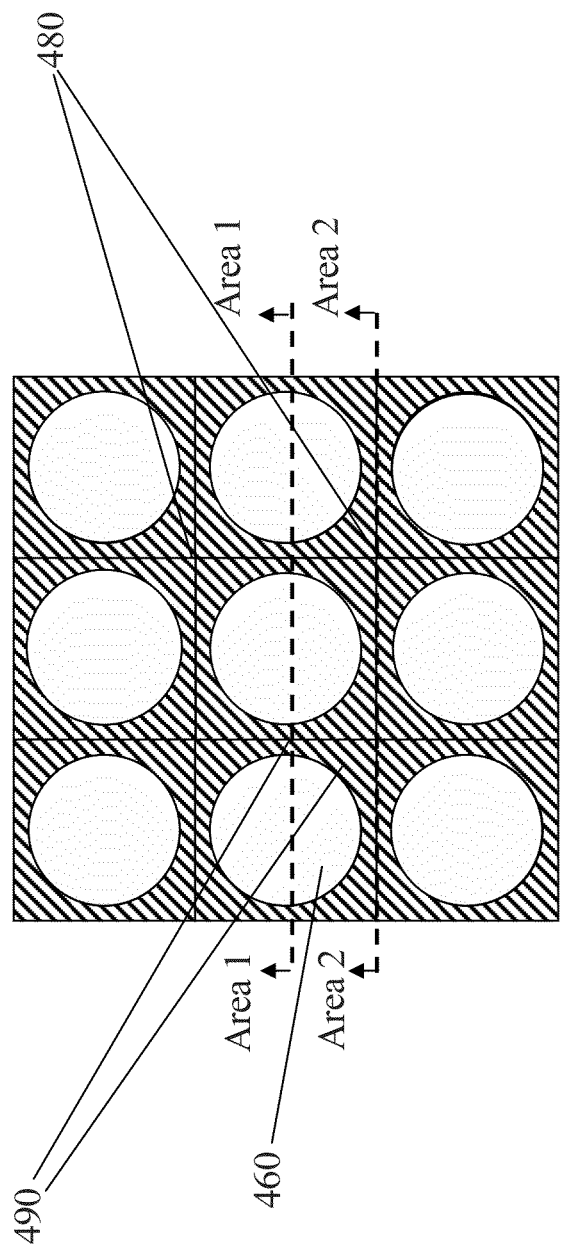

Referring first to FIG. 4Q, which is a top view of the upper lenslet sub-layer of the device 400, Area 1 is the portion of the device 400 that encompasses the apertures 460. Area 2 is the portion of the device 400 that does not encompass the apertures 460 and is between rows of apertures 460. Area 1 is completely free of insulating material, i.e., the conductive layers are suspended, while Area 2 includes insulating pillar structures to physically support the conductive layers.

The method 300 begins at step 302 by providing a substrate 415 that includes a conductive material 410, such as a metal, and a supporting member 405. The supporting member 405 can be a passivation layer on the top of a CMOS chip or a film of insulators on the top of a silicon substrate. The substrate 415 may be formed by the same method described with respect to FIGS. 2A-2C. In FIG. 4A, the substrate 415 includes a metal 410. The metal 410 may be any suitable material known in the art, including titanium nitride, tungsten, aluminum, copper, and combinations thereof. FIG. 4P is a top view of Areas 1 and 2 of substrate 415 in FIG. 4A.

At step 304, a second insulating material 440 is deposited over the substrate 415 as shown in FIG. 4B. The insulating layer includes any suitable insulating material, such as silicon oxide, silicon nitride, or silicon oxynitride.

Referring now to FIG. 4C, a photosensitive material 430 is deposited on the second insulating material 440 and patterned in step 306. In Area 1, the photosensitive material 430 is patterned so that the second insulating material 440 is completely covered or unexposed. In contrast, the photosensitive material 430 in Area 2 is patterned so that the second insulating material 440 is partially exposed.

Proceeding to step 308, the second insulating material 440 is etched. None of the second insulating layer 440 is etched in Area 1 of FIG. 4D, while some parts of second insulating layer 440 that are not covered by photosensitive material 430 are etched in Area 2 to form trenches 424. Etching is done by any suitable technique, including wet and dry etch. The photosensitive material 430 is removed.

In step 310, a first insulating material 420, which is different from the second insulating material 440, is filled in the trenches 424 in Area 2 to form insulating pillars 422 formed of first insulating material 420, and deposited on the second insulating material 440 in Area 1, as shown in FIG. 4E. The insulating pillars 422 help electrically insulate and physically support conductive material layers in the final structure. Area 1, in the final structure, does not include any insulating pillars 422.

The first insulating material 420 is planarized in step 312. The first insulating material 420 is completely removed from Area 1 to ensure that the final etch removes all insulating material from Area 1. If the first insulating material 420 is not completely removed from Area 1, it can form a layer that may not be removed during the final etching step. The excess of first insulating material 420 on top of the second insulating material 440 in Area 2 is removed to expose the top surface of insulating pillars 422 and planarized. In step 314, a conductive material 450 is deposited on the planarized surface of the first and second insulating materials 420 and 440 in Area 2 and on the second insulating layer 440 in Area 1. The conductive material 450 may be any suitable material, such as a metal.

Moving to step 316, a photosensitive material 430 is deposited and patterned on the conductive material 450 as shown in FIG. 4F. In Area 1, the photosensitive material 430 is patterned so that portions of the conductive material 450 are exposed while in Area 2, the patterned photosensitive material 430 completely covers the conductive material 450, leaving no portion exposed.

In step 318, the conductive material 450 is etched. As can be seen in FIG. 4G, in Area 1, the portions protected by the photosensitive material 430 remain, while those portions that are unprotected are etched away to form apertures 460 of lenslets. In Area 2, none of the conductive material 450 is etched because the photosensitive material 430 protects all of the conductive material 450 in Area 2. The photosensitive material 430 is removed. FIG. 4G illustrates a first lenslet sub-layer.

In step 320, steps 304 to 318 are repeated to form a second lenslet sub-layer over or above the first lenslet sub-layer. In FIG. 4H, a second insulating material 440 is deposited. FIG. 4I illustrates Areas 1 and 2 after a photosensitive material 430 is deposited on the second insulating material 440 and patterned. Again, the pattern leaves Area 1 completely covered or unexposed, while portions of the second insulating material 440 are exposed in Area 2. In FIG. 4J, the second insulating material 440 is etched. In Area 2, the etching forms trenches 424. In Area 1, the second insulating material 440 remains intact. The photosensitive material 430 is removed. In FIG. 4K, a first insulating material 420 is filled in the trenches 424 in Area 2 to form insulating pillars 422 formed by first insulating material 420, and deposited on the conductive material 450 in Area 1. The excess first insulating material 420 on top of the second insulating material 440 is removed to expose top surface of the insulating pillars 422 in Area 2, and the first insulating material 420 is completely removed in Area 1. A conductive material 450 is deposited on the planarized surface of the first insulating material 420 and second insulating material 440 in Area 2 and on the second insulating material 440 in Area 1. In FIG. 4L, a photosensitive material 430 is deposited on the conductive material 450 and patterned. Area 1 is patterned such that portions of the conductive material 450 are exposed, while Area 2 is patterned such that all of the conductive material 450 is covered or unexposed. In FIG. 4M, the uncovered conductive material 450 in Area 1 is etched to form apertures 460 of lenslets. FIG. 4M illustrates the second lenslet sub-layer above the first lenslet sub-layer. The photosensitive material 430 is removed. FIG. 4N illustrates Areas 1 and 2 after the method has been repeated multiple times to form multiple layers.

In step 322, a TSIR etch is performed. In the TSIR etch, the second insulating material 440 is completely removed in Area 1 and Area 2. In Area 2, cavities 470 are formed by the TSIR etch, as seen in FIG. 4O. The first insulating material 420 and second insulating material 440 are selected to have different etch rates. By providing materials with different etch rates, highly selective etching may be achieved so that only second insulating material 440 is etched and not insulating pillars 422. The high etch selectivity between the first insulating material 420 and the second insulating material 440 makes method 300 feasible for pillar formation to support the metal electrode.

As is shown in FIG. 4O, between two adjacent parallel conductive layers 450, a layer of insulating pillars 422 are in Area 2 to physically support the conductive material 450 in Area 1 and Area 2. Referring now to FIG. 4Q, the periphery 490 of each aperture 460 includes conductive layers 450 that are suspended and do not include any insulating material. The conductive material 450 in Area 1 is suspended, meaning it is not directly supported underneath by insulating pillars 422. In contrast, the conductive material 450 in Area 2 is supported by insulating pillars 422. The apertures 460 in each conductive layer 450 are vertically aligned with the apertures in other conductive layers. Referring back to FIG. 4Q, in one embodiment, the insulating pillar 422 is located at an inner center 480 of a square grid of four lenslets. In another embodiment, the insulating pillar 422 is located between two adjacent lenslets.

In an exemplary embodiment, a diameter of the apertures 460 is about 0.5 to 0.95 times a lenslet pitch. In another embodiment, a diameter of the insulating pillar structures 422 is about 0.1 to 0.4 times a lenslet pitch. In one embodiment, an insulating pillar structure sidewall angle is from about 60 to 90 degrees. A thickness of the conductive material 450 is typically about 20 to 500 nm.

FIG. 4Q illustrates the top view of Areas 1 and 2 in FIG. 4O. The overall structure of Area 1 and Area 2 provides a structure that prevents electron charging on the insulator of the lenslet in Area 1 and Area 2 and helps to extend the lifetime of the lenslet device. This is achieved by totally removing insulating material in Area 1 and minimizing insulating material in Area 2. In Area 1, there is no insulating material between two adjacent parallel conductor layers and the conductor layer is suspended. In Area 2, the insulator material is formed as a pillar to physically support the conductor layers so that when the electron beam hits the lenslet, reflected electrons do not hit an insulator sidewall and induce charging. The lenslet device that includes Area 1 or the metal electrode suspension can prevent insulating materials or high resistive materials from electron bombardment, which causes charging on the insulator or deteriorates the properties of the high resistive materials. The protection of the insulator or high resistive materials between metal electrodes in the lenslet from electron radiation, which prevents charging problems, can extend the stability and lifetime of the device 400.

The present disclosure provides for various advantageous methods and apparatus of reflective electron beam lithography. One of the broader forms of the present disclosure involves a device for reflective electron-beam lithography. The device includes a substrate, a plurality of conductive layers formed on the substrate, which are parallel to each other and separated by insulating pillar structures, and a plurality of apertures in each conductive layer. Apertures in each conductive layer are vertically aligned with the apertures in other conductive layers and a periphery of each aperture includes conductive layers that are suspended.

Another one of the broader forms of the present disclosure involves another device for reflective electron beam lithography. The device includes a substrate, a plurality of conductive layers formed on the substrate, which are parallel to each other and separated by insulating pillar structures, and a plurality of apertures in each conductive layer. The apertures in each conductive layer are vertically aligned with the apertures in other conductive layers and the insulating pillar structures are located at an inner center of a square grid of four lenslets.

Yet another of the broader forms of the present disclosure involves a method of making a device. The method includes depositing a first layer of a first insulating material on a substrate, wherein the substrate includes a first and second area, patterning the first insulating material to form trenches and a plurality of insulating pillar structures formed of the first insulating material in the second area and completely removing the first insulating material from the first area depositing a second insulating material in the first area and concurrently filling the trenches with the second insulating material in the second area, planarizing the second insulating material in the first area and exposing a top surface of the insulating pillars in the second area, depositing a conductive material on the planarized second insulating material and the insulating pillars, depositing a photosensitive material on the conductive material, patterning the first conductive material to form apertures for lenslets in the first area, whereby a first lenslet sub-layer is formed, forming a second lenslet sub-layer above the first lenslet sub-layer using the first and second insulation materials, and performing a total-second-insulator-removing (TSIR) etch to completely remove the second insulating material in the first area and the second area at the same time, such that the remaining conductive material is suspended in the first area.

The above-described diagrams are not necessarily to scale and are intended be illustrative and not limiting to a particular implementation. In the above description, numerous specific details are given to provide a thorough understanding of embodiments of the present disclosure. However, the above description of illustrated embodiments of the present disclosure is not intended to be exhaustive or to limit the present disclosure to the precise forms disclosed. One skilled in the relevant art will recognize that the present disclosure can be practiced without one or more of the specific details, or with other methods, components, etc. In other instances, well-known structures or operations are not shown or described in detail to avoid obscuring aspects of the present disclosure. While specific embodiments of, and examples for, the present disclosure are described herein for illustrative purposes, various equivalent modifications are possible within the scope of the present disclosure, as those skilled in the relevant art will recognize.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device, comprising:
   a substrate;
   a plurality of conductive layers formed on the substrate that are parallel to each other and separated by insulating pillar structures; and
   a plurality of apertures in each conductive layer, wherein the apertures in each conductive layer are vertically aligned with the apertures in other conductive layers and wherein a periphery of each aperture includes conductive layers that are suspended.

2. The device of claim 1, wherein a diameter of the apertures is about 0.5 to about 0.95 times a lenslet pitch.

3. The device of claim 1, wherein the conductive layers in the periphery of each aperture are not separated by the insulating pillar structures.

4. The device of claim 1, wherein a diameter of the insulating pillar structures is about 0.1 to about 0.4 times a lenslet pitch.

5. The device of claim 1, wherein the insulating pillar structures physically support the conductive layers in the periphery of each aperture.

6. The device of claim 5, wherein the insulating pillar structures are located at an inner center of a square grid of four lenslets.

7. The device of claim 5, wherein the insulating pillar structures are located between two adjacent lenslets.

8. The device of claim 1, wherein an insulating pillar structure sidewall angle is from about 60 degrees to about 90 degrees.

9. The device of claim 1, wherein a thickness of the conductive layers is about 20 nm to about 500 nm.

10. A device, comprising:
    a substrate;
    a plurality of conductive layers formed on the substrate that are parallel to each other and separated by insulating pillar structures; and
    a plurality of apertures in each conductive layer, wherein the apertures in each conductive layer are vertically aligned with the apertures in other conductive layers and wherein the insulating pillar structures are located at an inner center of a square grid of four lenslets.

11. The device of claim 10, wherein the conductive layers in a periphery of each aperture are not separated by the insulating pillar structures.

12. The device of claim 11, wherein the insulating pillar structures physically support the conductive layers in the periphery of each aperture.

13. The device of claim 10, wherein a diameter of the insulating pillar structures is about 0.1 to about 0.4 times a lenslet pitch.

14. The device of claim 10, wherein an insulating pillar structure sidewall angle is from about 60 degrees to about 90 degrees.

15. The device of claim 10, wherein a thickness of the conductive layers is about 20 nm to about 500 nm.

16. A method of making a device, comprising:
    (i) depositing a first layer of a first insulating material on a substrate, wherein the substrate includes a first area and a second area;
    (ii) patterning the first insulating material to form trenches and a plurality of insulating pillar structures formed of the first insulating material in the second area and completely removing the first insulating material from the first area;
    (iii) depositing a second insulating material in the first area and concurrently filling the trenches with the second insulating material in the second area;
    (iv) planarizing the second insulating material in the first area and exposing a top surface of the insulating pillars in the second area;
    (v) depositing a conductive material on the planarized second insulating material and the insulating pillars;
    (vi) patterning the conductive material to form apertures for lenslets in the first area, whereby a first lenslet sub-layer is formed;
    (vii) forming a second lenslet sub-layer above the first lenslet sub-layer using the first and second insulation materials; and
    (viii) performing a total-second-insulator-removing (TSIR) etch to completely remove the second insulating material in the first area and the second area simultaneously, such that the remaining conductive material is suspended in the first area.

17. The method of claim 16, wherein the TSIR etch is selective with respect to the first insulating material.

18. The method of claim 16, wherein the insulating pillar structures remain intact during the TSIR etch.

19. The method of claim 16, wherein the first insulating material comprises silicon dioxide and the second insulating material comprises silicon nitride.

20. The method of claim 16, wherein the insulating pillar structures are located at an inner center of a square grid of four lenslets, or between two adjacent lenslets.

* * * * *